United States Patent
Jeong et al.

(10) Patent No.: US 9,337,778 B2
(45) Date of Patent: May 10, 2016

(54) ADAPTIVE BIAS CIRCUIT AND POWER AMPLIFIER

(71) Applicant: SAMSUNG ELECTRO-MECHANICS CO., LTD., Suwon-Si, Gyeonggi-Do (KR)

(72) Inventors: Chan Yong Jeong, Suwon-Si (KR); Gyu Suck Kim, Suwon-Si (KR); Song Cheol Hong, Daejeon (KR); Tae Hwan Joo, Daejeon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 60 days.

(21) Appl. No.: 14/498,279

(22) Filed: Sep. 26, 2014

(65) Prior Publication Data

US 2015/0244326 A1 Aug. 27, 2015

(30) Foreign Application Priority Data

Feb. 24, 2014 (KR) .......................... 10-2014-0021384

(51) Int. Cl.
*H03G 3/20* (2006.01)
*H03F 3/04* (2006.01)
*H03F 1/02* (2006.01)
*H03F 3/21* (2006.01)

(52) U.S. Cl.
CPC ............ *H03F 1/0222* (2013.01); *H03F 1/0266* (2013.01); *H03F 3/211* (2013.01); *H03F 2200/102* (2013.01); *H03F 2200/504* (2013.01); *H03F 2203/21193* (2013.01)

(58) Field of Classification Search
USPC ......................................... 330/136, 127, 297

IPC ...................................... H03G 3/20; H03F 3/04
See application file for complete search history.

(56) References Cited

U.S. PATENT DOCUMENTS

| | | | |
|---|---|---|---|
| 2003/0146791 A1* | 8/2003 | Shvarts | H03F 1/025 330/297 |
| 2007/0249310 A1 | 10/2007 | Zhang | |
| 2008/0079489 A1* | 4/2008 | Grundlingh | H03G 3/20 330/136 |
| 2009/0153248 A1 | 6/2009 | Sun et al. | |
| 2011/0115557 A1* | 5/2011 | Hongo | H03F 1/0227 330/127 |
| 2012/0286873 A1 | 11/2012 | Li et al. | |
| 2013/0194037 A1* | 8/2013 | Takahashi | H03F 1/32 330/3 |
| 2014/0084700 A1* | 3/2014 | Anderson | H03F 1/0227 307/104 |
| 2014/0315504 A1* | 10/2014 | Sakai | H03F 1/02 455/127.2 |

FOREIGN PATENT DOCUMENTS

| | | |
|---|---|---|
| JP | 2007-259112 A | 10/2007 |
| JP | 2013-123237 A | 6/2013 |
| KR | 10-2007-0103698 A | 10/2007 |
| KR | 10-2008-0017952 A | 2/2008 |

* cited by examiner

*Primary Examiner* — Patricia T Nguyen
(74) *Attorney, Agent, or Firm* — NSIP Law

(57) ABSTRACT

A bias circuit may include an envelope detecting unit detecting an envelope of an input signal, a source voltage generating unit generating a source voltage using a power supply voltage, and an envelope amplifying unit receiving the power supply voltage and the source voltage as a driving voltage and amplifying an envelope signal detected by the envelope detecting unit to generate a first bias voltage.

20 Claims, 9 Drawing Sheets

ADAPTIVE BIAS CIRCUIT AND POWER AMPLIFIER

CROSS-REFERENCE TO RELATED APPLICATION

This application claims the benefit of Korean Patent Application No. 10-2014-0021384 filed on Feb. 24, 2014, with the Korean Intellectual Property Office, the disclosure of which is incorporated herein by reference.

BACKGROUND

The present disclosure relates to an adaptive bias circuit and a power amplifier.

In accordance with the development of the Information Technology (IT) industry, demand for wireless transceivers capable of transmitting and receiving mass amounts of information has gradually increased. In addition, wireless transceivers that are cheap, consumes relatively low amounts of power, and have high performance have been demanded.

In such wireless transceivers, there is a trend for a majority of internal circuit blocks to be integrated in a single chip using complementary metal oxide semiconductor (CMOS) process technology. However, to date, only power amplifiers have been able to be implemented using indium gallium phosphide (InGaP)/gallium arsenide (GaAs) hetero-junction bipolar transistor (HET) process technology, a compound semiconductor process technology, due to a problem with CMOS process technology itself.

In compound semiconductor process technology such as InGaP/GaAs HBT process technology, manufacturing costs of a device are higher, as compared with CMOS process technology, and devices should be formed to have a multi-chip structure, whereby it maybe difficult to couple such devices to a circuit block implemented by the CMOS process in order to improve linearity. For this reason, there are limitations in decreasing manufacturing costs for wireless transceivers. Therefore, research into CMOS process-based power amplifiers has been demanded.

In addition, in accordance with the implementation of high levels of integration of wireless transceivers, integration of transmitting and receiving ends as well as front ends has been demanded. Therefore, in order to implement a system on chip (SoC), it is necessary to stabilize all biases of power amplifiers.

Meanwhile, as a bias circuit providing a bias voltage to an existing power amplifier, an adaptive bias circuit capable of controlling a bias voltage depending on an envelope of an input signal has been used.

Such an adaptive bias circuit includes an envelope amplifying circuit in order to detect and amplify the envelope of the input signal. The envelope amplifying circuit includes two transistors stacked between a terminal receiving VDD, a power supply voltage, and a terminal receiving VS, a source voltage.

Here, since VDD and VS are supplied using a separate power supply circuit present outside of the power amplifier, it may be relatively complicated to implement the circuit and the circuit may be affected by external factors, such that the source voltage may be changed due to an influence from the outside. In the case in which the source voltage is changed, an operation of the envelope amplifying circuit sensitive to changes in the source voltage may become unstable.

The following Related Art Document (Patent Document 1), which relates to an amplifier using a dynamic bias, does not disclose a technical feature of providing a source voltage of a bias circuit using a power supply voltage of the bias circuit in order to stabilize a bias voltage.

[Related Art Document]
(Patent Document 1) Japanese Patent Laid-Open Publication No. 2013-123237

SUMMARY

An exemplary embodiment in the present disclosure may provide an adaptive bias circuit and a power amplifier capable of providing a source voltage of the bias circuit using a power supply voltage of the bias circuit in order to stabilize a bias voltage.

According to an exemplary embodiment in the present disclosure, an adaptive bias circuit may include: an envelope detecting unit detecting an envelope of an input signal; a source voltage generating unit generating a source voltage using a power supply voltage; and an envelope amplifying unit receiving the power supply voltage and the source voltage as a driving voltage and amplifying an envelope signal detected by the envelope detecting unit to generate a first bias voltage.

According to another exemplary embodiment in the present disclosure, an adaptive bias circuit may include: an envelope detecting unit detecting an envelope of an input signal; a source voltage generating unit generating a source voltage using a power supply voltage; an envelope amplifying unit receiving the power supply voltage and the source voltage as a driving voltage and amplifying an envelope signal detected by the envelope detecting unit to generate a first bias voltage; and an output dividing unit stabilizing the first bias voltage.

The source voltage generating unit may include: a current mirror circuit generating a first current between the power supply voltage and a ground and mirroring the first current to generate a second current; and a voltage generating circuit including a semiconductor device having a resistance level determined depending on a magnitude of the power supply voltage, and generating the source voltage by the resistance level of the semiconductor device and the second current.

The current mirror circuit may include: a first PMOS transistor having a source connected to a power supply voltage terminal, and a gate and a drain connected to each other; a first NMOS transistor having a drain connected to the drain of the first PMOS transistor of the current mirror circuit, a gate receiving a control voltage, and a source connected to the ground; and a second PMOS transistor having a source connected to the power supply voltage terminal, a gate connected to the gate of the first PMOS transistor, and a drain providing the second current.

The voltage generating circuit may include: a second NMOS transistor having a drain connected to the drain of the second PMOS transistor of the current mirror circuit and a source voltage terminal, a gate receiving the power supply voltage, and a source connected to the ground; and a stabilization circuit unit connected between the drain and the source of the second NMOS transistor to stabilize the source voltage provided through the source voltage terminal.

According to another exemplary embodiment in the present disclosure, a power amplifier may include: an envelope detecting unit detecting an envelope of an input signal; a source voltage generating unit generating a source voltage using a power supply voltage; an envelope amplifying unit receiving the power supply voltage and the source voltage as a driving voltage and amplifying an envelope signal detected by the envelope detecting unit to generate a first bias voltage; and an amplifying unit amplifying the input signal depending on the first bias voltage.

According to another exemplary embodiment in the present disclosure, a power amplifier may include: an envelope detecting unit detecting an envelope of an input signal; a source voltage generating unit generating a source voltage using a power supply voltage; an envelope amplifying unit receiving the power supply voltage and the source voltage as a driving voltage and amplifying an envelope signal detected by the envelope detecting unit to generate a first bias voltage; an output dividing unit stabilizing the first bias voltage; and an amplifying unit amplifying the input signal depending on the first bias voltage.

The envelope amplifying unit may include: a PMOS transistor having a source connected to a power supply voltage terminal, a gate connected to an output terminal of the envelope detecting unit, and a drain connected to a first connection node; and an NMOS transistor having a drain connected to the first connection node, a gate connected to the output terminal of the envelope detecting unit, and a source connected to the source voltage terminal, the drain and a body of the NMOS transistor being electrically connected to each other.

The source voltage generating unit may include: a current mirror circuit generating a first current between the power supply voltage and a ground and mirroring the first current to generate a second current; and a voltage generating circuit including a semiconductor device having a resistance level determined depending on a magnitude of the power supply voltage, and generating the source voltage by the resistance level of the semiconductor device and the second current.

The current mirror circuit may include: a first PMOS transistor having a source connected to the power supply voltage terminal, and a gate and a drain connected to each other; a first NMOS transistor having a drain connected to the drain of the first PMOS transistor of the current mirror circuit, a gate receiving a control voltage, and a source connected to the ground; and a second PMOS transistor having a source connected to the power supply voltage terminal, a gate connected to the gate of the first PMOS transistor, and a drain providing the second current.

The voltage generating circuit may include: a second NMOS transistor having a drain connected to the drain of the second PMOS transistor of the current mirror circuit and a source voltage terminal, a gate receiving the power supply voltage, and a source connected to the ground; and a stabilization circuit unit connected between the drain and the source of the second NMOS transistor to stabilize the source voltage provided through the source voltage terminal.

The output dividing unit may generate a second bias voltage having a level different from that of the first bias voltage using the first bias voltage and provide the first and second bias voltages.

The amplifying unit may include: a first power amplifier amplifying the input signal depending on the first bias voltage;

and a second power amplifier amplifying the input signal depending on the second bias voltage.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
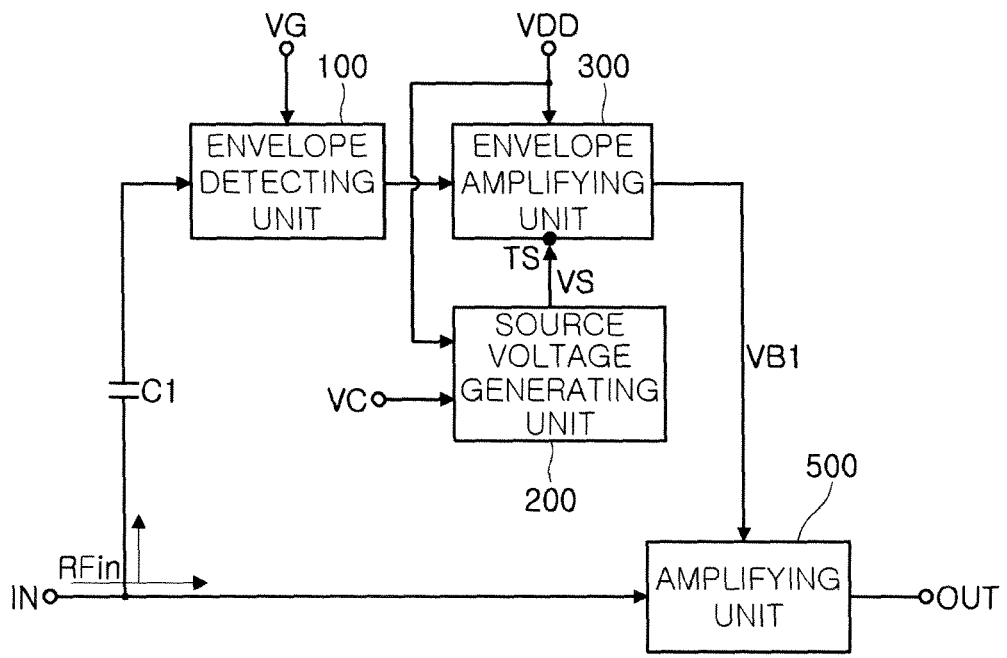
FIG. 1 is a block diagram illustrating a bias circuit and a power amplifier according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

FIG. 1 is a block diagram illustrating a bias circuit and a power amplifier according to an exemplary embodiment of the present disclosure.

Referring to FIG. 1, the bias circuit according to an exemplary embodiment of the present disclosure may include an envelope detecting unit 100, a source voltage generating unit 200, and an envelope amplifying unit 300.

In addition, the power amplifier according to an exemplary embodiment of the present disclosure may include the above-mentioned bias circuit and an amplifying unit 500.

The envelope detecting unit 100 may receive a gate voltage VG as a driving voltage and detect an envelope of an input signal RFin input through an input terminal IN and a coupling capacitor C1.

Figure 8:
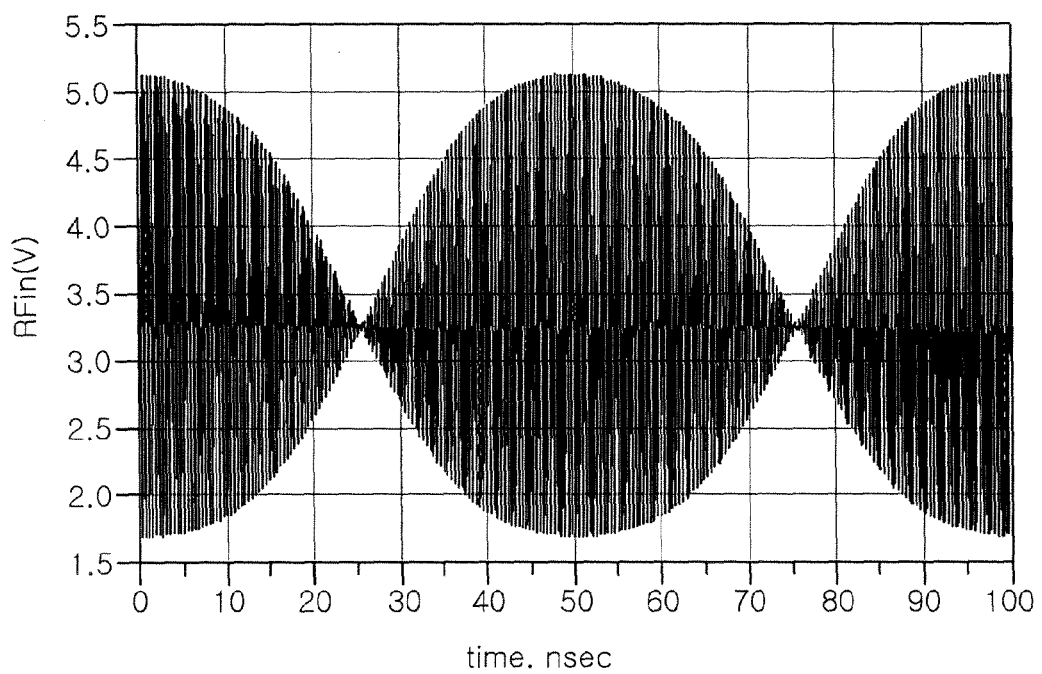
FIG. 8 is an illustrative diagram of an input signal according to an exemplary embodiment of the present disclosure.

For example, the input signal RFin may be a radio frequency signal having an envelope as shown in FIG. 8. The coupling capacitor C1 may be a blocking capacitor passing an alternating current (AC) signal therethrough and blocking direct current (DC) power.

The source voltage generating unit 200 may generate a source voltage VS using a power supply voltage VDD. For example, the power supply voltage VDD may be provided from a separate power supply apparatus, and the source voltage VS may be generated using the power supply voltage VDD by the bias circuit itself according to an exemplary embodiment of the present disclosure in order to significantly decrease influence from the outside.

The envelope amplifying unit 300 may receive the power supply voltage VDD and the source voltage VS as a driving voltage and amplify an envelope signal detected by the envelope detecting unit 100 to generate a first bias voltage VB1.

The amplifying unit 500 may amplify the input signal RFin input through the input terminal IN depending on the first bias voltage VB1 and output the amplified signal through an output terminal OUT. For example, the amplifying unit 500 may be a power amplifier amplifying power of the input signal RFin.

Figure 2:
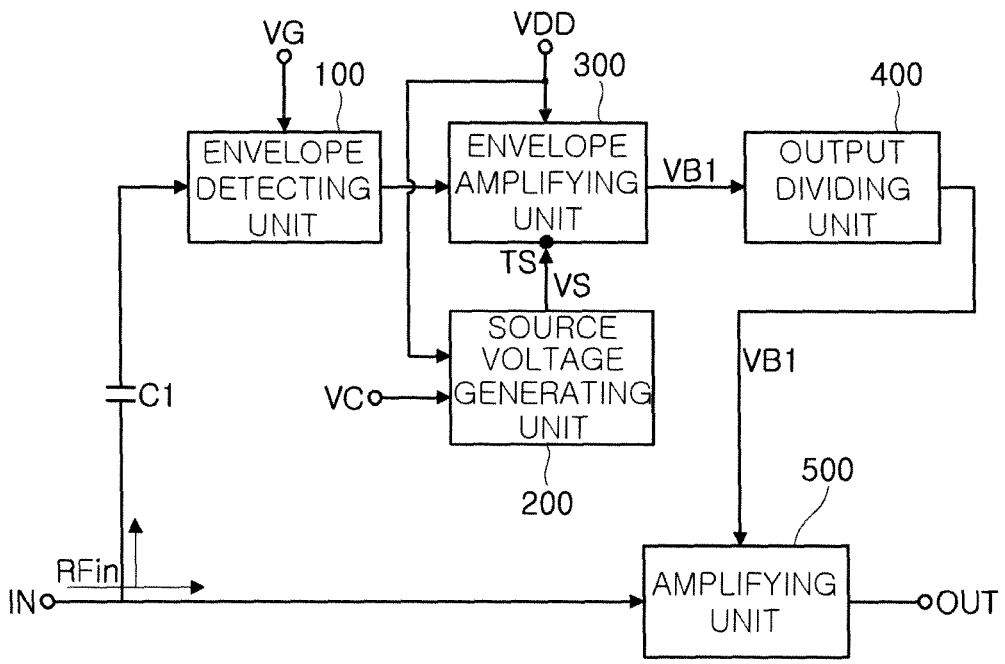
FIG. 2 is a block diagram illustrating a bias circuit and a power amplifier according to another exemplary embodiment of the present disclosure.
Figure 3:
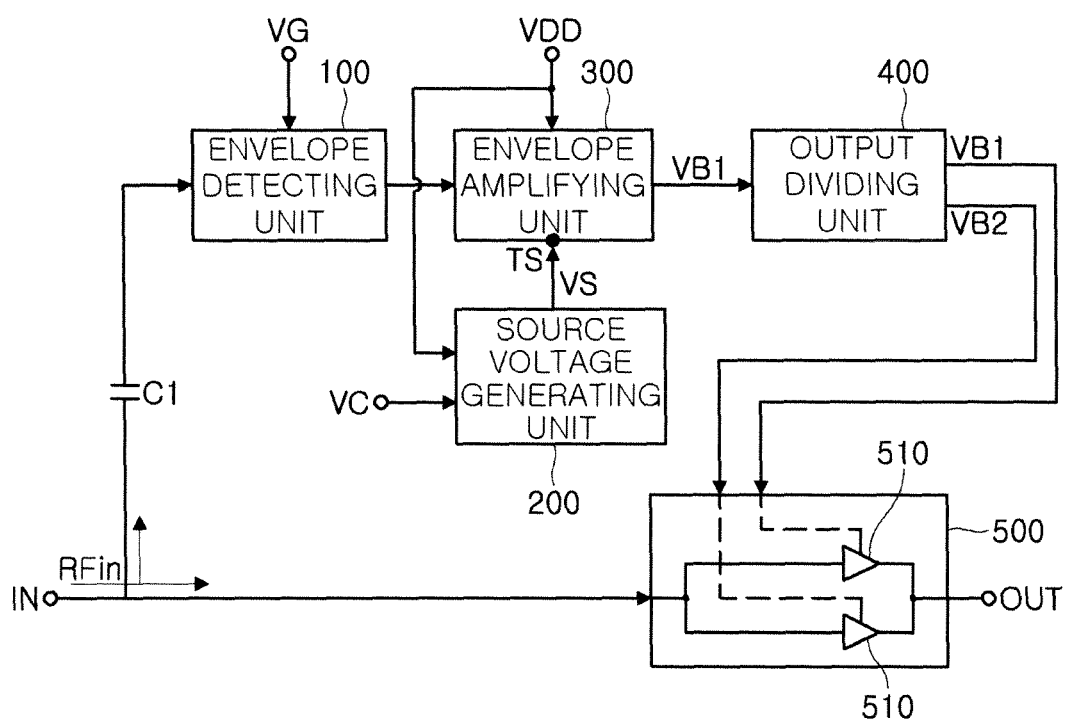
FIG. 3 is a block diagram illustrating a bias circuit and a power amplifier according to another exemplary embodiment of the present disclosure.

FIG. 2 is a block diagram illustrating a bias circuit and a power amplifier according to another exemplary embodiment of the present disclosure, and FIG. 3 is a block diagram illustrating a bias circuit and a power amplifier according to another exemplary embodiment of the present disclosure.

Referring to FIGS. 2 and 3, the bias circuit according to another exemplary embodiment of the present disclosure may include an envelope detecting unit 100, a source voltage generating unit 200, an envelope amplifying unit 300, and an output dividing unit 400.

In addition, the power amplifier according to another exemplary embodiment of the present disclosure may include the above-mentioned bias circuit and an amplifying unit 500.

A description for operations that are the same as the operations described with reference to FIG. 1 among operations of the envelope detecting unit 100, the source voltage generating unit 200, the envelope amplifying unit 300, and the amplifying unit 500 shown in FIGS. 2 and 3 will be omitted in order to avoid an overlapped description.

Referring to FIGS. 2 and 3, the output dividing unit 400 may stabilize the first bias voltage VB1.

Referring to FIG. 3, the output dividing unit 400 may generate a second bias voltage VB2 having a level different from that of the first bias voltage VB1 using the first bias voltage VB1 and provide the first and second bias voltages.

In this case, the amplifying unit 500 may include a first power amplifier 510 and a second power amplifier 520, wherein the first power amplifier 510 may amplify the input signal depending on the first bias voltage VB1 and the second power amplifier 520 may amplify the input signal depending on the second bias voltage VB2.

Meanwhile, the output dividing unit 400 may be implemented using at least one passive device such as a resistor, a capacitor, an inductor, and the like, in order to remove AC components included in the first and second bias voltages VB1 and VB2 and decrease changes in voltage to maintain a desired voltage level.

Figure 4:
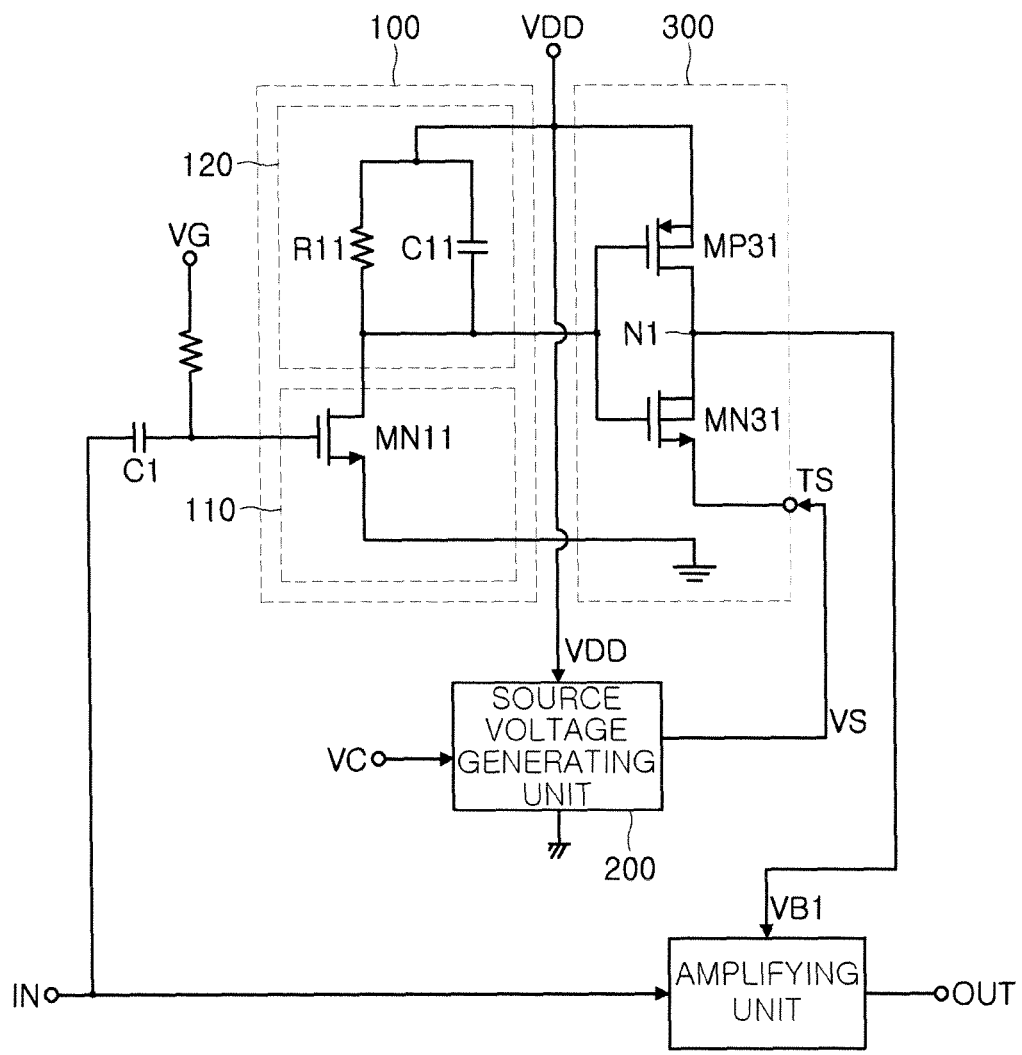
FIG. 4 is a block diagram of an internal circuit of the bias circuit and the power amplifier of FIG. 1.
Figure 5:
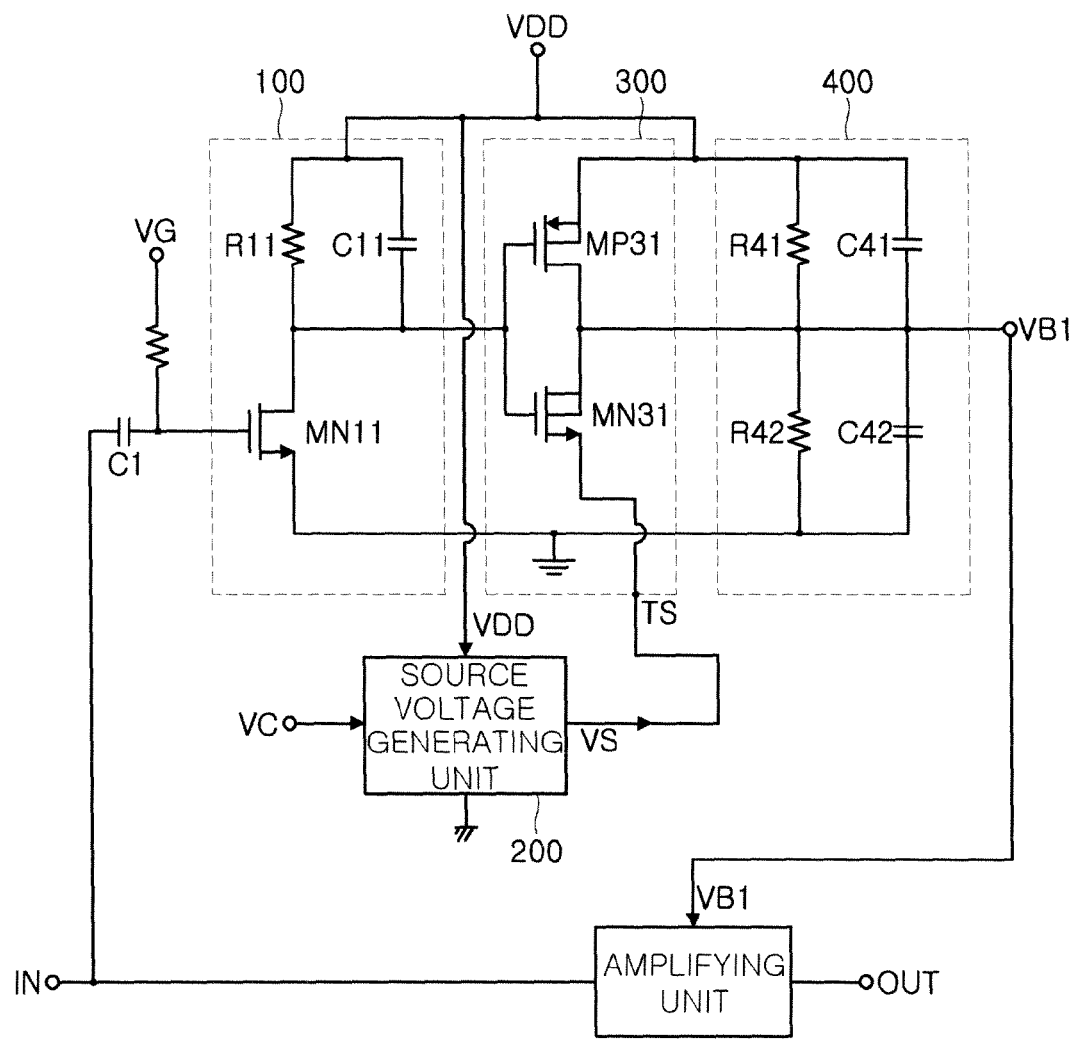
FIG. 5 is a block diagram of an internal circuit of the bias circuit and the power amplifier of FIG. 2.
Figure 6:
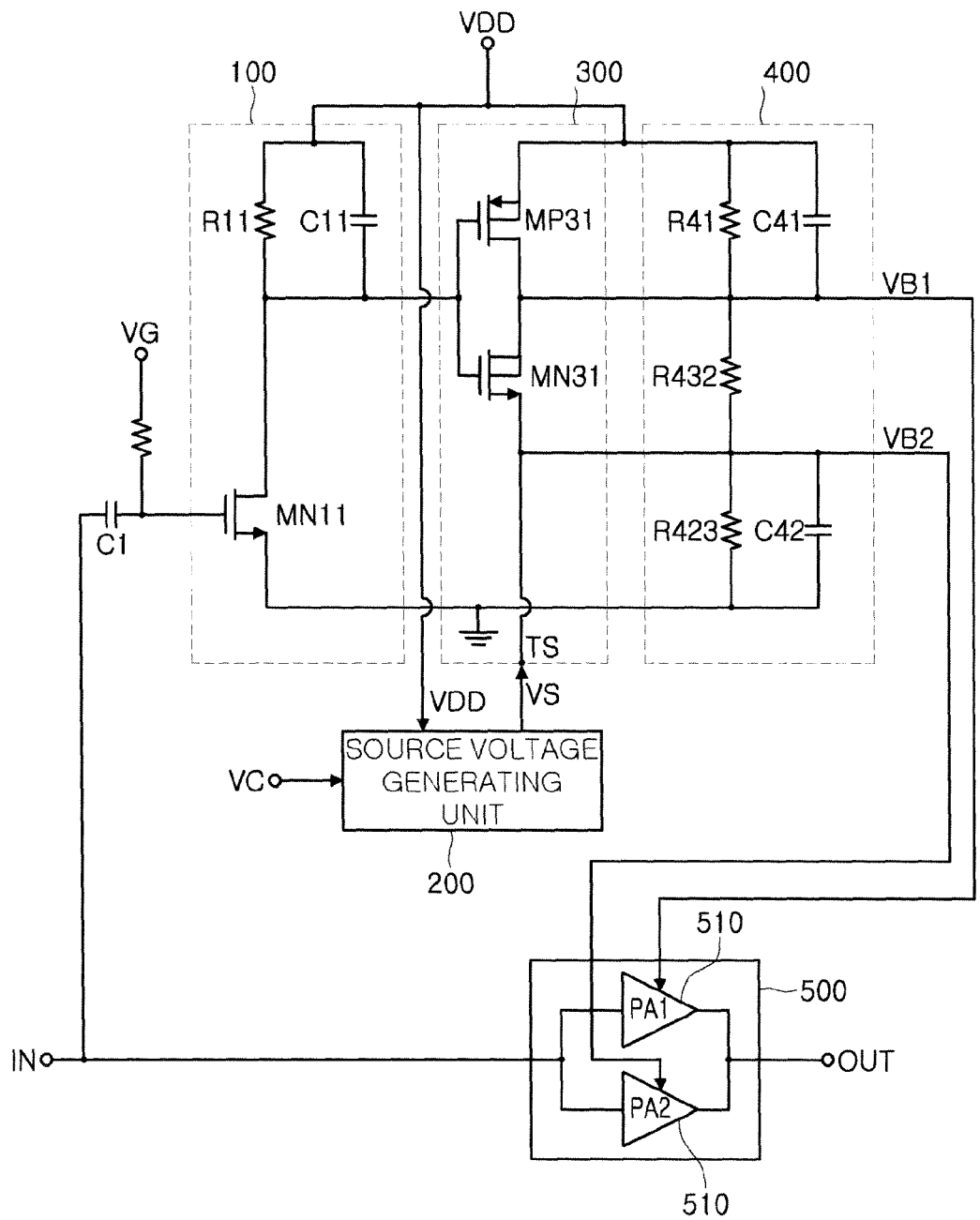
FIG. 6 is a block diagram of an internal circuit of the bias circuit and the power amplifier of FIG. 3.

FIG. 4 is a block diagram of an internal circuit of the bias circuit and the power amplifier of FIG. 1, FIG. 5 is a block diagram of an internal circuit of the bias circuit and the power amplifier of FIG. 2, and FIG. 6 is a block diagram of an internal circuit of the bias circuit and the power amplifier of FIG. 3.

Referring to FIGS. 4 through 6, the envelope detecting unit 100 may include a signal amplifying unit 110 and an envelope extracting unit 120.

The signal amplifying unit 110 may include a metal oxide semiconductor (MOS) transistor M11 receiving a gate voltage VG for driving. The MOS transistor M11 may have a gate receiving the input signal RFin through the coupling capacitor C1, a source connected to a ground, and a drain connected to the envelope extracting unit 120.

The MOS transistor M11 of the signal amplifying unit 110 may amplify the input signal RFin and provide the amplified signal to the envelope extracting unit 120.

As an example, the envelope extracting unit 120 may include a resistor R11 and a capacitor C11 (RC circuit) connected to each other in parallel between a drain of the MOS transistor M11 and a power supply voltage VDD terminal.

Since the signal is provided from the drain of the MOS transistor M11 to the envelope amplifying unit 300, the RC circuit R11 and C11 of the envelope extracting unit 120 may act as a low pass filter at the drain of the MOS transistor M11 to extract an envelope from the signal output from the signal amplifying unit 110 and provide the extracted envelope to the envelope amplifying unit 300.

Here, the envelope extracting unit 120 is not limited to including the RC circuits R11 and C11, but may include any unit that may extract an envelope of a radio frequency signal.

For example, the envelope amplifying unit 300 may include a P-channel MOS (PMOS) transistor MP31 and an N-channel MOS (NMOS) transistor MN31.

The PMOS transistor MP31 may have a source connected to the power supply voltage VDD terminal, a gate connected to an output terminal of the envelope detecting unit 100, and a drain connected to a first connection node N1.

The NMOS transistor MN31 may have a drain connected to the first connection node N1, a gate connected to the output terminal of the envelope detecting unit 100, and a source connected to the source voltage VS terminal.

Therefore, since each of the gates of the PMOS transistor MP31 and the NMOS transistor MN31 receives the envelope signal from the envelope detecting unit 100, the PMOS transistor MP31 and the NMOS transistor MN31 may be operated depending on the envelope signal from the envelope detecting unit 100.

For example, when a large signal is input as an input of the envelope detecting unit 100, an output voltage of the envelope detecting unit 100 may drop from the power supply voltage VDD to a predetermined voltage. Then, a voltage at an output terminal of the envelope amplifying unit 300 may rise from an initial bias voltage to a predetermined voltage. In more detail, when a voltage level of the envelope signal is high, the PMOS transistor MP31 and the NMOS transistor MN31 are operated in a turned-off state and a turned-on state, respectively, such that the source voltage VS lower than the power supply voltage VDD may be output as the first bias voltage VB1. On the contrary, when the voltage level of the envelope signal is low, the PMOS transistor MP31 and the NMOS transistor MN31 are operated in a turned-on state and a turned-off state, respectively, such that the power supply voltage VDD may be output as the first bias voltage VB1.

Therefore, the first bias voltage VB1 adaptively varied depending on the voltage level of the envelope signal may be output.

Meanwhile, in the NMOS transistor MN31, the drain and a body may be electrically connected to each other.

Therefore, when the first bias voltage has a preset value or above, a PN junction diode of the NMOS transistor MN31 may be turned on to limit the first bias voltage so as not to be increased to the preset voltage or more.

Therefore, a function of limiting the first bias voltage may be implemented without using a separate limit circuit. As a result, the envelope amplifying unit 300 may be protected from gate oxide breakdown that may occur due to an increase in the first bias voltage.

Referring to FIG. 5, the output dividing unit 400 may include, for example, at least first and second dividing resistors R41 and R42 connected to each other in series between the power supply voltage VDD terminal and the ground, and the first bias voltage VB1 may be provided from a connection node between the first and second dividing resistors R41 and R42.

Here, first and second capacitors C41 and C42 may be connected in parallel with the first and second dividing resistors R41 and R42, respectively, and the first bias voltage VB1 may be stabilized by the first and second dividing resistors R41 and R42 and the first and second capacitors C41 and C42 as described above.

An implementation circuit of the output dividing unit 400 as described above is only an example, and the present disclosure is not limited thereto.

Referring to FIG. 6, the output dividing unit 400 may include at least first to third dividing resistors R41 to R43 connected to each other in series between the power supply voltage VDD terminal and a ground, the first bias voltage VB1 may be provided from a connection node between the first and second dividing resistors R41 and R42, and the second bias voltage VB2 may be provided from a connection node between the second and third dividing resistors R42 and R43.

Here, first and second capacitors C41 and C42 may be connected in parallel with the first and third dividing resistors R41 and R43, respectively, and the second bias voltage VB2 maybe stabilized by the first to third dividing resistors R41 to R43 and the first and second capacitors C41 and C42 as described above.

An implementation circuit of the output dividing unit 400 as described above is only an example, and the present disclosure is not limited thereto.

In addition, referring to FIGS. 3 and 6, the amplifying unit 500 may include, for example, a first power amplifier 510 and a second power amplifier 520 connected to each other in parallel in order to increase amplifying efficiency.

The first power amplifier 510 may amplify the input signal depending on the first bias voltage VB1, and the second power amplifier 520 may amplify the input signal depending on the second bias voltage VB2.

Figure 7:
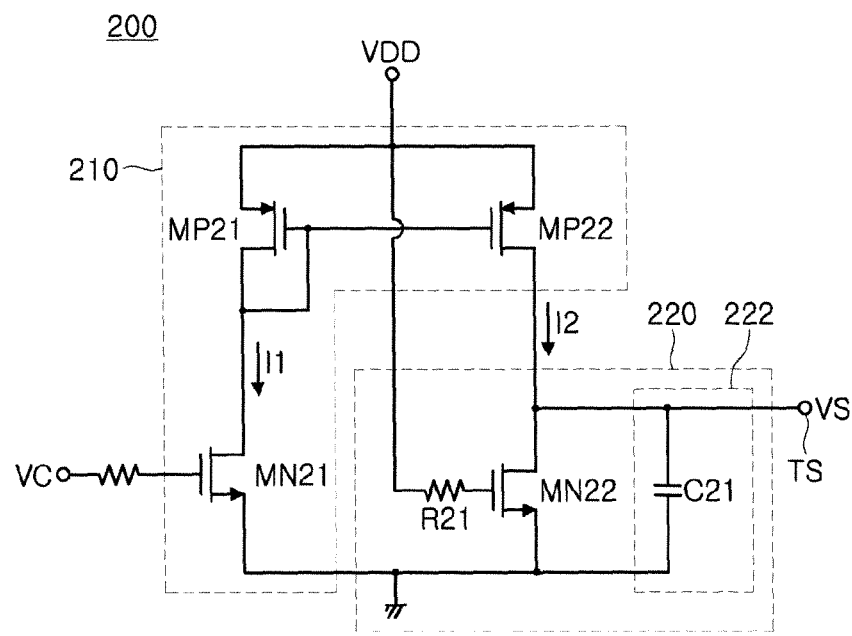
FIG. 7 is a circuit diagram of a source voltage generating unit according to an exemplary embodiment of the present disclosure.

FIG. 7 is a circuit diagram of a source voltage generating unit according to an exemplary embodiment of the present disclosure.

Referring to FIG. 7, the source voltage generating unit 200 may include, for example, a current mirror circuit 210 and a voltage generating circuit 220.

The current mirror circuit 210 may generate a first current I1 between the power supply voltage VDD and the ground and mirror the first current I1 to generate a second current I2.

The voltage generating circuit 220 may include a semiconductor device having a resistance level determined depending on a magnitude of the power supply voltage VDD, and may generate the source voltage VS by the resistance level of the semiconductor device and the second current I2.

As an example, the current mirror circuit 210 may include a first PMOS transistor MP21, a first NMOS transistor MN21, and a second PMOS transistor MP22.

The first PMOS transistor MP21 may have a source connected to the power supply voltage VDD terminal, and a gate and a drain connected to each other.

The first NMOS transistor MN21 may have a drain connected to the drain of the first PMOS transistor MP21 of the current mirror circuit 210, a gate receiving a control voltage VC, and a source connected to the ground.

In addition, the second PMOS transistor MP22 may have a source connected to the power supply voltage VDD terminal, a gate connected to the gate of the first PMOS transistor MP21, and a drain providing the second current I2.

Here, the first NMOS transistor MN21 may generate the first current I1 depending on the control voltage VC, wherein the first current I1 may be varied when the control voltage VC is varied and may be constant when the control voltage VC is fixed. Therefore, the first current I1 may flow through the first PMOS transistor MP21 and the second PMOS transistor MP22.

Then, the second PMOS transistor MP22 may be connected to the first PMOS transistor MP21 in a current mirror form, as described above, to mirror the first current I1 flowing through the first PMOS transistor MP21, thereby generating the second current I2.

Here, when the second PMOS transistor MP22 has the same size as that of the first PMOS transistor MP21, the second current I2 may be the same as the first current I2, and when the second PMOS transistor MP22 has a size different from that of the first PMOS transistor MP21, the second current I2 may be determined depending on a ratio between the sizes of the first PMOS transistor MP21 and the second PMOS transistor MP22.

In addition, the voltage generating circuit 220 may include, for example, a second NMOS transistor MN22 and a stabilization circuit unit 222.

The second NMOS transistor MN22 may have a drain connected to the drain of the second PMOS transistor MP22 of the current mirror circuit 210 and a source voltage terminal TS, a gate receiving the power supply voltage VDD, and a source connected to the ground.

Here, the second NMOS transistor MN22 may act as a resistor in the case in which it receives the power supply voltage VDD through its gate to thereby be operated as a triode region, such that a voltage determined by an equivalent resistance of the second NMOS transistor MN22 and the second current I2 may be provided as the source voltage VS.

In addition, in the case in which the second NMOS transistor MN22 acts as the resistor in the triode region, a change in the source voltage VS depending on a change in the second current I2 may be small. Therefore, the source voltage VS may be insensitive to an influence from the outside.

In addition, the stabilization circuit unit 222 may be connected between the drain and the source of the second NMOS transistor MN22 to stabilize the source voltage VS provided through the source voltage terminal TS.

For example, the stabilization circuit unit 222 may include a capacitor C21 as shown in FIG. 7, and the present disclosure is not limited thereto. That is, the stabilization circuit unit 222 may be any circuit that may stabilize a voltage.

FIG. 8 is an illustrative diagram of an input signal according to an exemplary embodiment of the present disclosure.

Referring to FIG. 8, the input signal RFin may be, for example, a radio frequency signal having an envelope, such as a wireless local area network (WLAN) communications signal, a cellular communications signal, or the like. Although a signal waveform swung by +1.5V and −1.5V based on approximately 3.5V has been shown in FIG. 8, this is only an example, and the present disclosure is not limited thereto.

Figure 9:
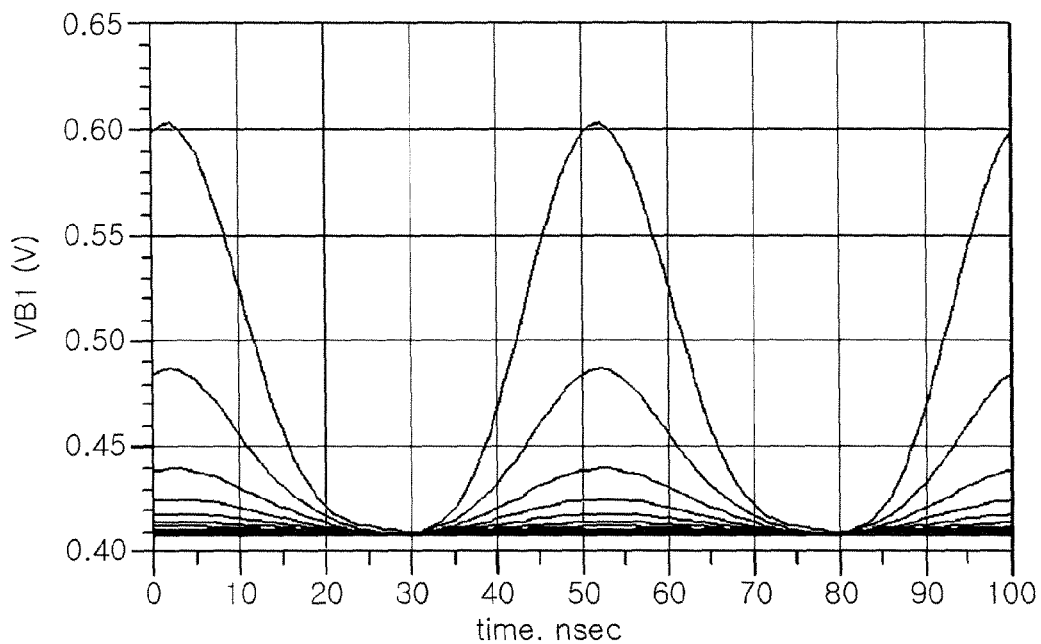
FIG. 9 is an illustrative diagram of a first bias voltage according to an exemplary embodiment of the present disclosure.
Figure 10:
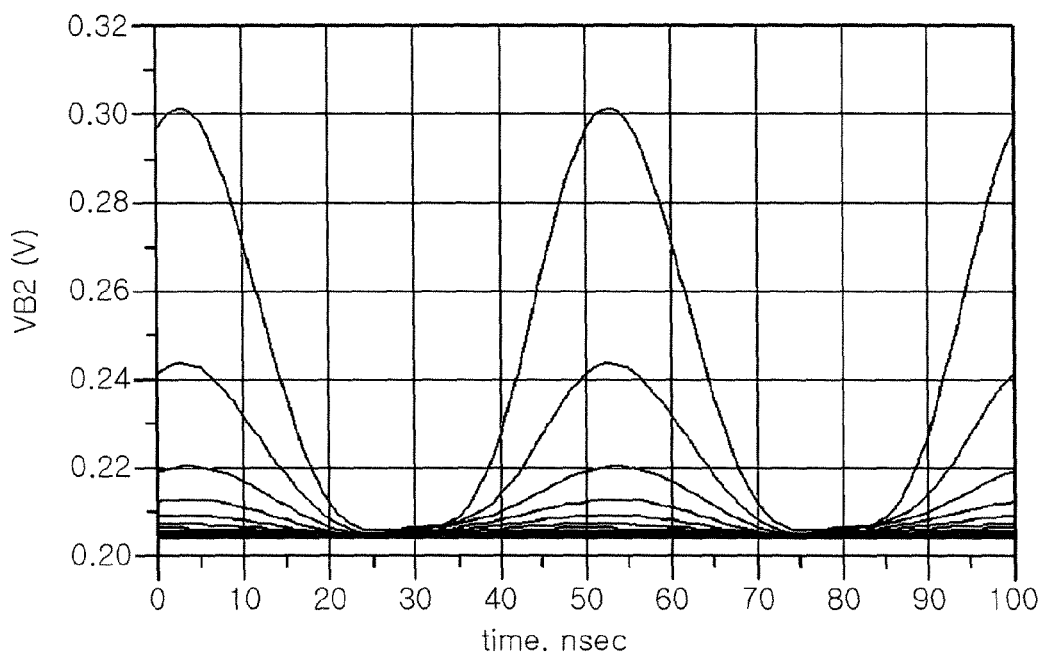
FIG. 10 is an illustrative diagram of a second bias voltage according to an exemplary embodiment of the present disclosure.

FIG. 9 is an illustrative diagram of a first bias voltage according to an exemplary embodiment of the present disclosure, and FIG. 10 is an illustrative diagram of a second bias voltage according to an exemplary embodiment of the present disclosure.

Referring to FIG. 9, it may be appreciated that the first bias voltage VB1 determined depending on a voltage level of the envelope signal extracted from the input signal RFin may be changed from 0V to 0.60V depending on the voltage level of the envelope signal.

Referring to FIG. 10, it may be appreciated that the second bias voltage VB2 determined depending on the voltage level of the envelope signal extracted from the input signal RFin may be changed from 0V to 0.30V depending on the voltage level of the envelope signal.

The first and second bias voltages VB1 and VB2 shown in FIGS. 9 and 10 are only examples, and the present disclosure is not limited thereto.

Figure 11:
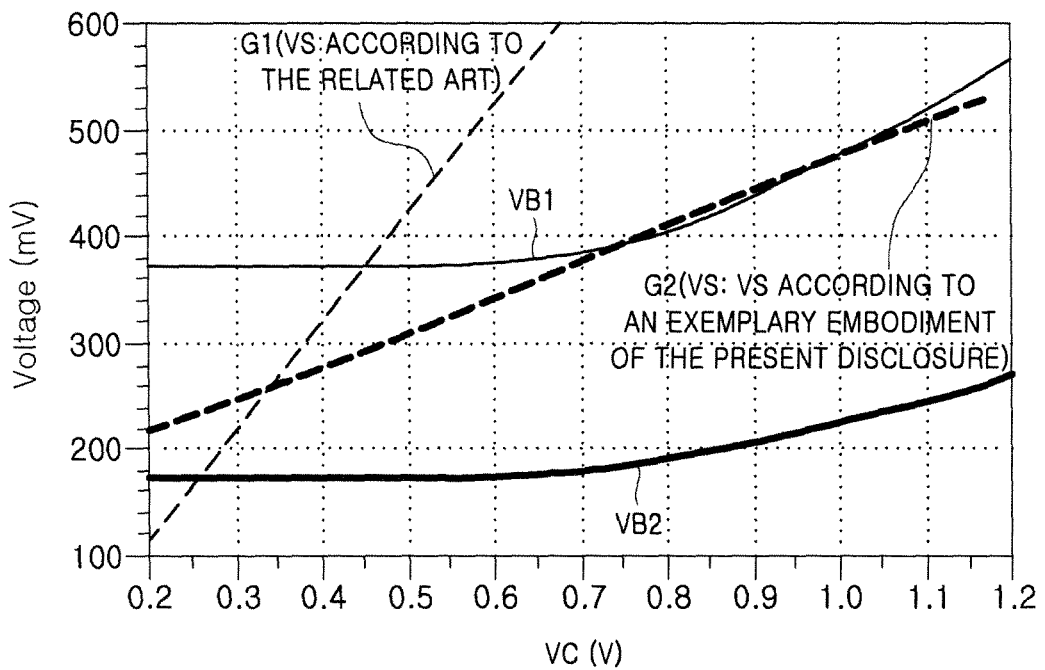
FIG. 11 is a graph illustrating characteristics of a source voltage and a bias voltage according to an exemplary embodiment of the present disclosure.

FIG. 11 is a graph illustrating characteristics of a source voltage and a bias voltage according to an exemplary embodiment of the present disclosure.

In FIG. 11, G1 is a graph illustrating a source voltage according to the related art, and G2 is a graph illustrating a source voltage according to an exemplary embodiment of the present disclosure. In addition, VB1 and VB2 are graphs illustrating first and second bias voltages, respectively.

Referring to G1 and G2 shown in FIG. 11, it may be appreciated that a source voltage (VS of G1) according to the related art is sensitively varied depending on a control voltage VC provided from the outside, and it may be appreciated that a source voltage (VS of G2) according to an exemplary embodiment of the present disclosure is relatively insensitive to the control voltage VC, which is an external voltage, as compared with the source voltage according to the related art.

Figure 12:
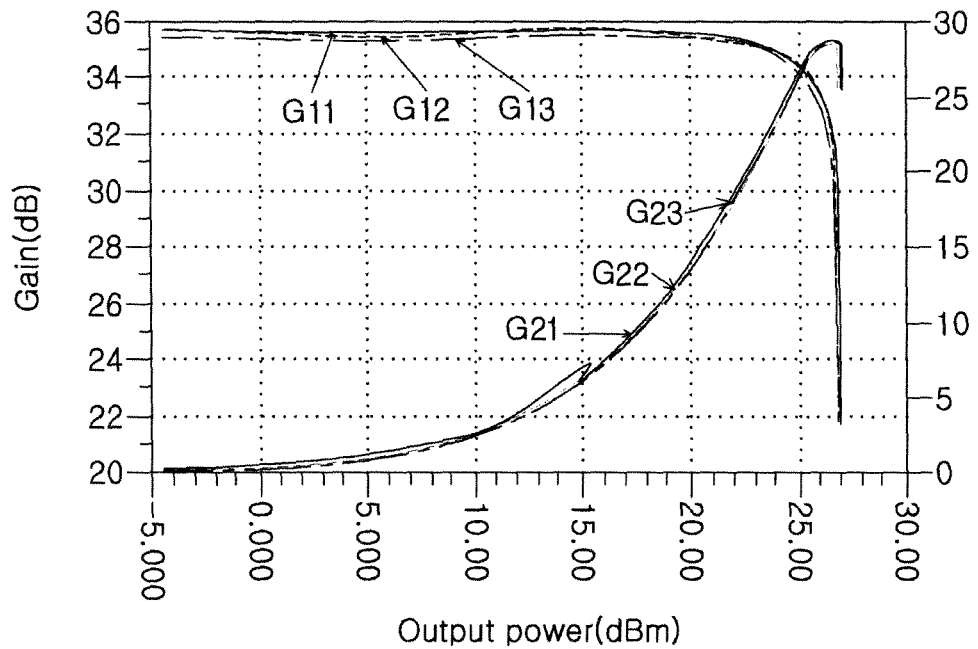
FIG. 12 is a graph illustrating gain (GAIN) and efficiency (PAE) characteristics of the power amplifier according to an exemplary embodiment of the present disclosure.

FIG. 12 is a graph illustrating gain (GAIN) and efficiency (PAE) characteristics of the power amplifier according to an exemplary embodiment of the present disclosure. In FIG. 12, G11 is a graph illustrating an output power-gain for the source voltage VS according to the related art, G12 is a graph illustrating an output power-gain at the time of a variation in the source voltage VS according to the related art by +0.01, and G13 is a graph illustrating an output power-gain at the time of a variation in the source voltage VS according to the related art by −0.01. In addition, G21, G22, and G23 are graphs illustrating output power-efficiencies (PA3) depending on the source voltages, respectively.

Referring to G11, G12, and G13 of FIG. 12, it may be appreciated that even though the source voltage VS is varied due to an influence from the outside such as a temperature change, or the like, a gain (GAIN) of the power amplifier according to an exemplary embodiment of the present disclosure is not substantially changed.

In addition, referring to G21, G22, and G23, it may be appreciated that even though the source voltage VS is varied due to an influence from the outside such as a temperature change, or the like, an efficiency of the power amplifier according to an exemplary embodiment of the present disclosure is not substantially changed.

Figure 13:
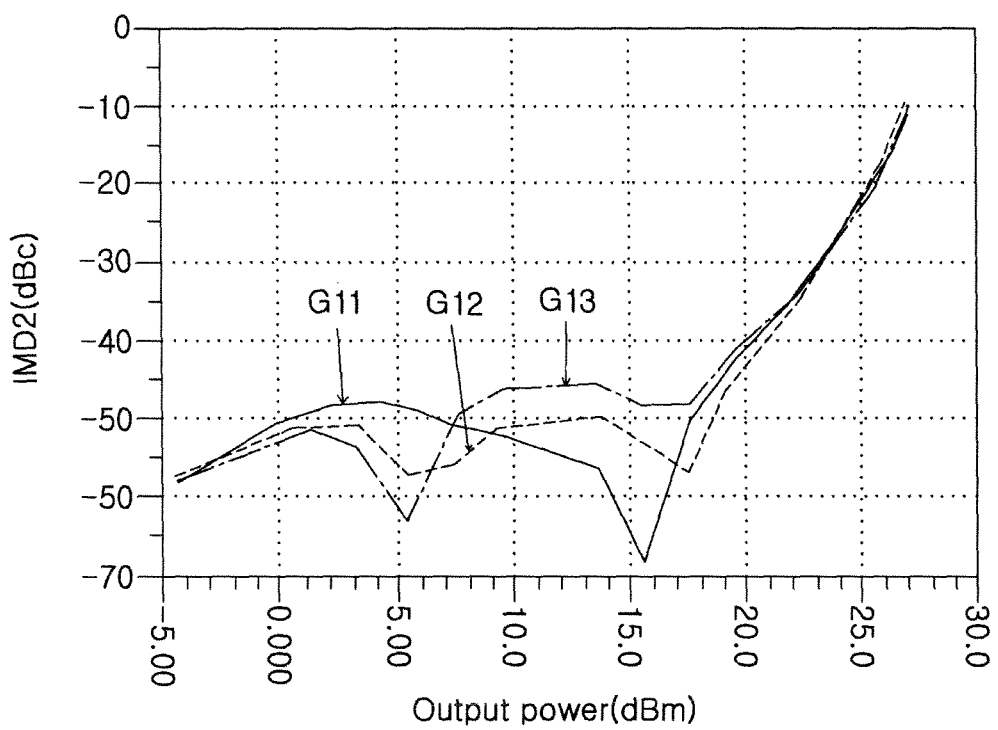
FIG. 13 is a graph illustrating $3^{rd}$ modulation distortion (IMD3) characteristics of the power amplifier according to an exemplary embodiment of the present disclosure.

FIG. 13 is a graph illustrating $3^{rd}$ modulation distortion (IMD3) characteristics of the power amplifier according to an exemplary embodiment of the present disclosure.

In FIG. 13, G11 is a graph illustrating an output power-$3^{rd}$ modulation distortion (IMD3) for the source voltage VS according to the related art, G12 is a graph illustrating an output power-$3^{rd}$ modulation distortion (IMD3) at the time of a variation in the source voltage VS according to the related art by +0.01, and G13 is a graph illustrating an output power-b $3^{rd}$ modulation distortion (IMD3) at the time of a variation in the source voltage VS according to the related art by −0.01.

Referring to G11, G12, and G13 of FIG. 13, it may be appreciated that even though the source voltage VS is varied due to an influence from the outside such as a temperature change, or the like, a $3^{rd}$ modulation distortion (IMD3 of the power amplifier according to an exemplary embodiment of the present disclosure is less than approximately −40 [dBc] and not greatly changed.

As described above, according to exemplary embodiments of the present disclosure, the bias circuit capable of adaptively providing the bias voltage depending on a level of the input signal and insensitive to a change from the outside may be provided. Therefore, the power amplifier may be stably operated by the bias circuit that is more stably operated. As a result, the bias circuit and the power amplifier advantageous for integration may be provided.

As set forth above, with the bias circuit and the power amplifier according to exemplary embodiments of the present disclosure, the source voltage of the bias circuit is provided using an operation voltage of the bias circuit in order to stabilize the bias voltage, whereby the bias circuit capable of adaptively providing the bias voltage depending on the level of the input signal and insensitive to the change from the outside may be provided. Therefore, the power amplifier may be stably operated by the bias circuit that is more stably operated. As a result, the bias circuit and the power amplifier advantageous for integration may be provided.

While exemplary embodiments have been shown and described above, it will be apparent to those skilled in the art that modifications and variations could be made without departing from the spirit and scope of the present disclosure as defined by the appended claims.

What is claimed is:

1. An adaptive bias circuit comprising:
    an envelope detecting unit detecting an envelope of an input signal;
    a source voltage generating unit generating a source voltage using a power supply voltage; and
    an envelope amplifying unit receiving the power supply voltage and the source voltage as a driving voltage and amplifying an envelope signal detected by the envelope detecting unit to generate a first bias voltage.

2. The adaptive bias circuit of claim 1, wherein the source voltage generating unit includes:
    a current mirror circuit generating a first current between the power supply voltage and a ground and mirroring the first current to generate a second current; and
    a voltage generating circuit including a semiconductor device having a resistance level determined depending on a magnitude of the power supply voltage, and generating the source voltage by the resistance level of the semiconductor device and the second current.

3. The adaptive bias circuit of claim 2, wherein the current mirror circuit includes:
    a first P-channel metal oxide semiconductor (PMOS) transistor having a source connected to a power supply voltage terminal, and a gate and a drain connected to each other;
    a first N-channel channel metal oxide semiconductor (NMOS) transistor having a drain connected to the drain of the first PMOS transistor of the current mirror circuit, a gate receiving a control voltage, and a source connected to the ground; and
    a second PMOS transistor having a source connected to the power supply voltage terminal, a gate connected to the gate of the first PMOS transistor, and a drain providing the second current.

4. The adaptive bias circuit of claim 3, wherein the voltage generating circuit includes:
    a second NMOS transistor having a drain connected to the drain of the second PMOS transistor of the current mirror circuit and a source voltage terminal, a gate receiving the power supply voltage, and a source connected to the ground; and a stabilization circuit unit connected between the drain and the source of the second NMOS transistor to stabilize the source voltage provided through the source voltage terminal.

5. An adaptive bias circuit comprising:

an envelope detecting unit detecting an envelope of an input signal;

a source voltage generating unit generating a source voltage using a power supply voltage;

an envelope amplifying unit receiving the power supply voltage and the source voltage as a driving voltage and amplifying an envelope signal detected by the envelope detecting unit to generate a first bias voltage; and an output dividing unit stabilizing the first bias voltage.

6. The adaptive bias circuit of claim 5, wherein the source voltage generating unit includes:

a current mirror circuit generating a first current between the power supply voltage and a ground and mirroring the first current to generate a second current; and a voltage generating circuit including a semiconductor device having a resistance level determined depending on a magnitude of the power supply voltage, and generating the source voltage by the resistance level of the semiconductor device and the second current.

7. The adaptive bias circuit of claim 6, wherein the current mirror circuit includes:

a first PMOS transistor having a source connected to a power supply voltage terminal, and a gate and a drain connected to each other;

a first NMOS transistor having a drain connected to the drain of the first PMOS transistor of the current mirror circuit, a gate receiving a control voltage, and a source connected to the ground; and a second PMOS transistor having a source connected to the power supply voltage terminal, a gate connected to the gate of the first PMOS transistor, and a drain providing the second current.

8. The adaptive bias circuit of claim 7, wherein the voltage generating circuit includes a second NMOS transistor having a drain connected to the drain of the second PMOS transistor of the current mirror circuit and a source voltage terminal, a gate receiving the power supply voltage, and a source connected to the ground; and a stabilization circuit unit connected between the drain and the source of the second NMOS transistor to stabilize the source voltage provided through the source voltage terminal.

9. A power amplifier comprising:

an envelope detecting unit detecting an envelope of an input signal;

a source voltage generating unit generating a source voltage using a power supply voltage;

an envelope amplifying unit receiving the power supply voltage and the source voltage as a driving voltage and amplifying an envelope signal detected by the envelope detecting unit to generate a first bias voltage; and an amplifying unit amplifying the input signal depending on the first bias voltage.

10. The power amplifier of claim 9, wherein the envelope amplifying unit includes:

a PMOS transistor having a source connected to a power supply voltage terminal, a gate connected to an output terminal of the envelope detecting unit, and a drain connected to a first connection node; and an NMOS transistor having a drain connected to the first connection node, a gate connected to the output terminal of the envelope detecting unit, and a source connected to the source voltage terminal, the drain and a body of the NMOS transistor being electrically connected to each other.

11. The power amplifier of claim 9, wherein the source voltage generating unit includes:

a current mirror circuit generating a first current between the power supply voltage and a ground and mirroring the first current to generate a second current; and a voltage generating circuit including a semiconductor device having a resistance level determined depending on a magnitude of the power supply voltage, and generating the source voltage by the resistance level of the semiconductor device and the second current.

12. The power amplifier of claim 11, wherein the current mirror circuit includes:

a first PMOS transistor having a source connected to a power supply voltage terminal, and a gate and a drain connected to each other;

a first NMOS transistor having a drain connected to the drain of the first PMOS transistor of the current mirror circuit, a gate receiving a control voltage, and a source connected to the ground; and a second PMOS transistor having a source connected to the power supply voltage terminal, a gate connected to the gate of the first PMOS transistor, and a drain providing the second current.

13. The power amplifier of claim 12, wherein the voltage generating circuit includes:

a second NMOS transistor having a drain connected to the drain of the second PMOS transistor of the current mirror circuit and a source voltage terminal, a gate receiving the power supply voltage, and a source connected to the ground; and a stabilization circuit unit connected between the drain and the source of the second NMOS transistor to stabilize the source voltage provided through the source voltage terminal.

14. A power amplifier comprising:

an envelope detecting unit detecting an envelope of an input signal;

a source voltage generating unit generating a source voltage using a power supply voltage;

an envelope amplifying unit receiving the power supply voltage and the source voltage as a driving voltage and amplifying an envelope signal detected by the envelope detecting unit to generate a first bias voltage;

an output dividing unit stabilizing the first bias voltage; and an amplifying unit amplifying the input signal depending on the first bias voltage.

15. The power amplifier of claim 14, wherein the envelope amplifying unit includes:

a PMOS transistor having a source connected to a power supply voltage terminal, a gate connected to an output terminal of the envelope detecting unit, and a drain connected to a first connection node; and an NMOS transistor having a drain connected to the first connection node, a gate connected to the output terminal of the envelope detecting unit, and a source connected to the source voltage terminal, the drain and a body of the NMOS transistor being electrically connected to each other.

16. The power amplifier of claim 15, wherein the source voltage generating unit includes:
- a current mirror circuit generating a first current between the power supply voltage and a ground and mirroring the first current to generate a second current; and
- a voltage generating circuit including a semiconductor device having a resistance level determined depending on a magnitude of the power supply voltage, and generating the source voltage by the resistance level of the semiconductor device and the second current.

17. The power amplifier of claim 16, wherein the current mirror circuit includes:
- a first PMOS transistor having a source connected to the power supply voltage terminal, and a gate and a drain connected to each other;
- a first NMOS transistor having a drain connected to the drain of the first PMOS transistor of the current mirror circuit, a gate receiving a control voltage, and a source connected to the ground; and
- a second PMOS transistor having a source connected to the power supply voltage terminal, a gate connected to the gate of the first PMOS transistor, and a drain providing the second current.

18. The power amplifier of claim 17, wherein the voltage generating circuit includes:
- a second NMOS transistor having a drain connected to the drain of the second PMOS transistor of the current mirror circuit and a source voltage terminal, a gate receiving the power supply voltage, and a source connected to the ground; and
- a stabilization circuit unit connected between the drain and the source of the second NMOS transistor to stabilize the source voltage provided through the source voltage terminal.

19. The power amplifier of claim 18, wherein the output dividing unit generates a second bias voltage having a level different from that of the first bias voltage using the first bias voltage and provides the first and second bias voltages.

20. The power amplifier of claim 19, wherein the amplifying unit includes:
- a first power amplifier amplifying the input signal depending on the first bias voltage; and
- a second power amplifier amplifying the input signal depending on the second bias voltage.

\* \* \* \* \*